(12) United States Patent
Chou et al.

(10) Patent No.: US 11,875,058 B2
(45) Date of Patent: Jan. 16, 2024

(54) DATA STORAGE DEVICE AND NON-VOLATILE MEMORY CONTROL METHOD

(71) Applicant: Silicon Motion, Inc., Hsinchu County (TW)

(72) Inventors: Po-Sheng Chou, Hsinchu County (TW); Hsiang-Yu Huang, Taoyuan (TW)

(73) Assignee: Silicon Motion, Inc., Jhubei (TW)

( * ) Notice: Subject to any disclaimer, the term of this patent is extended or adjusted under 35 U.S.C. 154(b) by 130 days.

(21) Appl. No.: 17/648,679

(22) Filed: Jan. 24, 2022

(65) Prior Publication Data

US 2022/0269443 A1 Aug. 25, 2022

(30) Foreign Application Priority Data

Feb. 24, 2021 (TW) .................. 110106464

(51) Int. Cl.
*G06F 12/00* (2006.01)
*G06F 3/06* (2006.01)

(52) U.S. Cl.
CPC .......... *G06F 3/0659* (2013.01); *G06F 3/0619* (2013.01); *G06F 3/0679* (2013.01)

(58) Field of Classification Search
CPC .... G06F 3/0659; G06F 3/0619; G06F 3/0679; G06F 2212/1032; G06F 2212/7201; G06F 2212/7208; G06F 2212/7211; G06F 12/0246; G06F 3/064; G06F 3/0614; G06F 3/0658; G11C 29/76; G11C 2029/0409; G11C 2211/5641; G11C 11/5642; G11C 16/26; G11C 16/3422; G11C 29/42
USPC ......................................... 711/114
See application file for complete search history.

(56) References Cited

U.S. PATENT DOCUMENTS

| | | | | |
|---|---|---|---|---|
| 3,878,338 A | * | 4/1975 | Hardy | H04Q 11/06 370/368 |
| 2016/0225461 A1 | | 8/2016 | Tuers et al. | |
| 2017/0262197 A1 | | 9/2017 | Tan | |
| 2019/0066809 A1 | * | 2/2019 | Kumar | G11C 29/50004 |
| 2019/0325970 A1 | | 10/2019 | Nagashima | |

FOREIGN PATENT DOCUMENTS

| | | | |
|---|---|---|---|
| KR | 20130048507 A | * | 1/2013 |
| KR | 20190113437 A | * | 1/2019 |
| TW | 201732822 A | | 9/2017 |

* cited by examiner

*Primary Examiner* — Mardochee Chery
(74) *Attorney, Agent, or Firm* — Wang Law Firm, Inc.

(57) ABSTRACT

A control method for a multi-channel non-volatile memory is shown. When reading a read target on the non-volatile memory, the controller increases the read count of the monitored unit to which the read target belongs and, based on the read count, determines whether to move data of the monitored unit covering the read target to a safe space to deal with reading interference. The monitored unit is smaller than a cross-channel management unit in read-count group. The controller accesses a parallel accessing space of the non-volatile memory in parallel through all of the channels, and allocates the parallel accessing space based on the cross-channel management unit.

16 Claims, 4 Drawing Sheets

DATA STORAGE DEVICE AND NON-VOLATILE MEMORY CONTROL METHOD

CROSS REFERENCE TO RELATED APPLICATIONS

This Application claims the benefit of priority to Taiwan Patent Application No. 110106464, filed on Feb. 24, 2021, the entirety of which is incorporated by reference herein.

BACKGROUND OF THE INVENTION

Field of the Invention

The present invention relates to solutions to reading interference of data storage devices.

Description of the Related Art

There are various forms of non-volatile memory (NVM) for long-term data storage, such as flash memory, magnetoresistive random access memory (magnetoresistive RAM), ferroelectric RAM, resistive RAM, spin transfer torque-RAM (STT-RAM), and so on. These types of non-volatile memory may be used as the storage medium in a data storage device.

Non-volatile memory usually has special storage characteristics. In this technical field, control technologies based on the special storage characteristics of non-volatile memory are being developed. For example, data stored in non-volatile memory may be damaged due to repeated reading. This phenomenon is called reading interference. The control technology for non-volatile memory must provide solutions to reading interference.

BRIEF SUMMARY OF THE INVENTION

A control technology for multi-channel non-volatile memory is proposed in the present invention to deal with reading interference.

A data storage device in accordance with an exemplary embodiment of the present invention includes a non-volatile memory, and a controller that accesses the non-volatile memory in parallel through multiple channels. When reading a read target on the non-volatile memory, the controller increases the read count of the monitored unit to which the read target belongs and, based on the read count, determines whether to move data of the monitored unit covering the read target to a safe space to deal with reading interference. The monitored unit is smaller than a cross-channel management unit in read-count group. The controller accesses a parallel accessing space of the non-volatile memory in parallel through all of the channels, and allocates the parallel accessing space based on the cross-channel management unit.

In an exemplary embodiment, when the read count is above the first threshold, the controller moves the data of the monitored unit covering the read target to the safe space. When the read count does not exceed the first threshold but above the second threshold, the controller checks the bit error rate of the read target. When the bit error rate is higher than a critical value, the controller moves the data of the monitored unit covering the read target to the safe space.

In an exemplary embodiment, the non-volatile memory includes a pseudo-single-level cell storage area and a multi-level cell storage area. When the read target is within the pseudo-single-level cell storage area and the read count is above the third threshold, the controller moves the data of the monitored unit covering the read target to the safe space. When the read target is within the multi-level cell storage area and the read count is above the fourth threshold, the controller moves the data of the monitored unit covering the read target to the safe space. The third threshold is higher than the fourth threshold.

When the read target is within the pseudo-single-level cell storage area, and the read count not exceeding the third threshold is above the fifth threshold, the controller checks the bit error rate of the read target. When the bit error rate is higher than a critical value, the controller moves the data of the monitored unit covering the read target to the safe space.

When the read target is within the multi-level cell storage area, and the read count not exceeding the fourth threshold is above the sixth threshold, the controller checks the bit error rate of the read target. When the bit error rate is higher than the critical value, the controller moves the data of the monitored unit covering the read target to the safe space. The fifth threshold is higher than the sixth threshold.

In an exemplary embodiment, the non-volatile memory is a flash memory having N×M dies to be accessed in parallel by the controller through N channels, each channel is shared by M dies in an interleaving manner, and N and M are integers. The N×M dies each provide a block to form a cross-channel management unit that is managed as a super block. Each block includes a plurality of pages, and the read target is one page.

In every M dies of the same channel, each die may provide one block to form one monitored unit, and thereby each monitored unit includes M blocks. The controller moves M blocks with reading interference to a destination space in the same channel without moving the other (N−1)×M blocks that are in the same super block as the M blocks with reading interference. The controller changes to regard the destination space and the non-shifted (N−1)×M blocks as one super block.

Each monitored unit may be one block. The controller moves one block with reading interference to a destination block in the same die without moving the other (N×M−1) blocks that are in the same super block as the block with reading interference. The controller changes to regard the destination block and the non-shifted (N×M−1) blocks as one super block.

As for the K×M dies in each group of K channels, each die may provide one block to form one monitored unit, and thereby each monitored unit includes K×M blocks. N is an integer multiple of K. The controller moves K×M blocks with reading interference to a destination space in the same K channels without moving the other (N−K)×M blocks that are in the same super block as the K×M blocks with reading interference. The controller changes to regard the destination space and the non-shifted (N−K)×M blocks as one super block.

The aforementioned controller may be implemented in other architectures. The foregoing concept can be used to implement a non-volatile memory control method.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments of carrying out the invention. This description is made for the purpose of illustrating the general principles of the invention and should not be taken in a limiting sense. The scope of the invention is best determined by reference to the appended claims.

A non-volatile memory for long-term data retention may be a flash memory, a magnetoresistive random access memory (magnetoresistive RAM), a ferroelectric RAM, a resistive RAM, a spin transfer torque-RAM (STT-RAM) and so on. The following discussion uses flash memory as an example but not intended to limit thereto.

Today's data storage devices often use flash memory as the storage medium for storing user data from the host. There are many types of data storage devices, including memory cards, universal serial bus (USB) flash devices, solid-state drives (SSDs), and so on. In another exemplary embodiment, a flash memory may be packaged with a controller to form a multiple-chip package called eMMC (embedded multimedia card).

A data storage device using a flash memory as a storage medium can be applied in a variety of electronic devices, including a smartphone, a wearable device, a tablet computer, a virtual reality device, etc. A calculation module of an electronic device may be regarded as a host that operates the data storage device equipped on the electronic device to access the flash memory within the data storage device.

A data center may be built with data storage devices using flash memories as the storage medium. For example, a server may operate an array of SSDs to form a data center. The server may be regarded as a host that operates the SSDs to access the flash memories within the SSDs.

Flash memory has its special storage characteristics which are described below.

The host side distinguishes data by logical addresses (for example, logical block addresses LBAs or global host page numbers GHPs). Mapping data is dynamically updated to map the logical addresses to the physical space of the flash memory.

Figure 1:
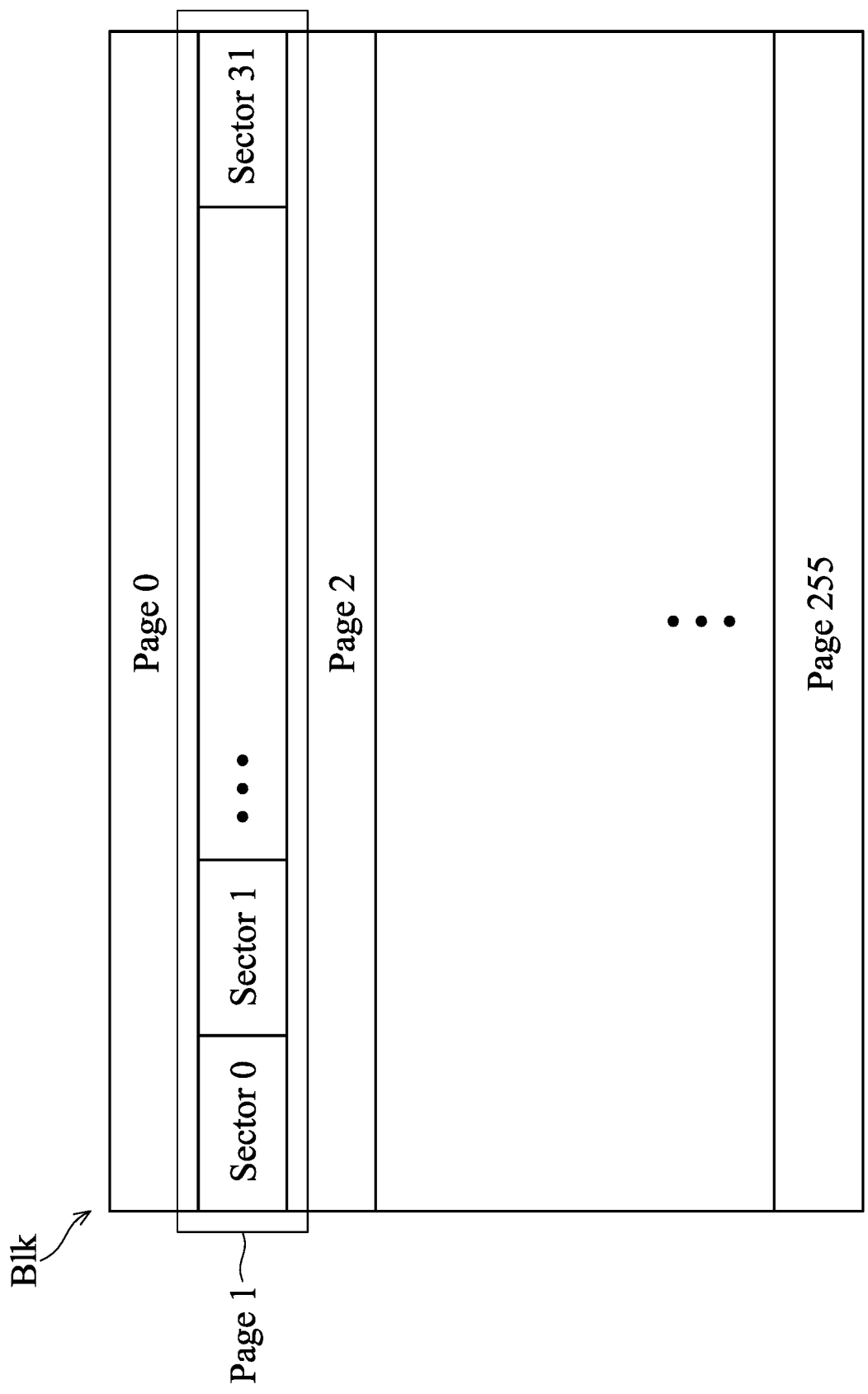
FIG. 1 illustrates the architecture of one block BLK.

The physical space of a flash memory is divided into a plurality of blocks. FIG. 1 illustrates the architecture of one block BLK.

As shown, one block BLK includes a plurality of pages (e.g., page 0 to page 255). Each page includes a plurality of sectors (e.g., 32 sectors per page), and each sector may store 512B user data. Thus, each page may provide 16 KB of storage space.

In order to improve the data throughput, a multi-channel accessing technology is adopted in the present invention. A large space can be accessed in parallel through multiple channels. A flash memory may include a plurality of dies. The dies may be grouped into multiple groups, and the dies of the same group are accessed through the same channel. In an exemplary embodiment, the dies of the same group are accessed through the same channel in an interleaving manner.

Figure 2:
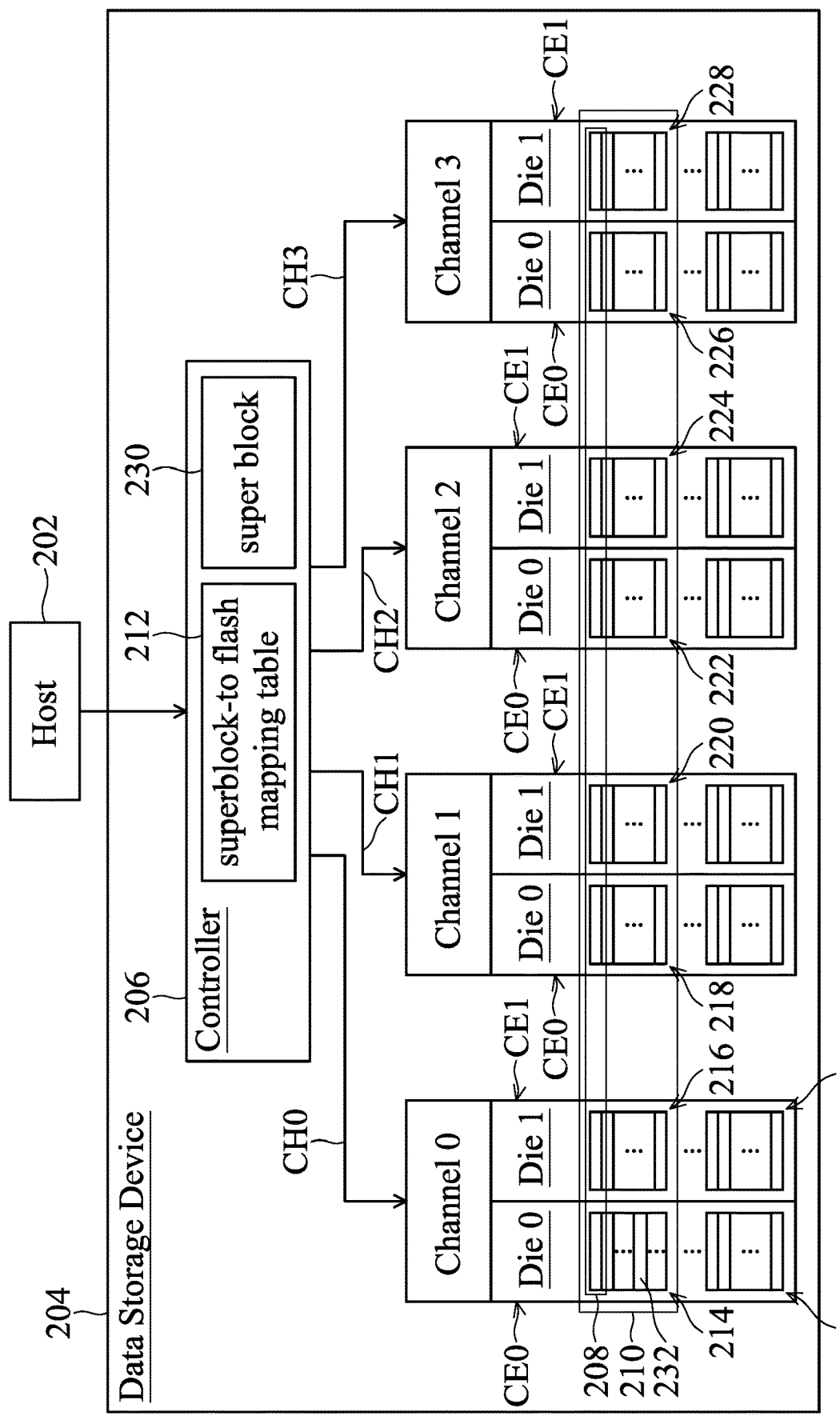
FIG. 2 illustrates a multi-channel accessing architecture in accordance with an exemplary embodiment of the present invention.

FIG. 2 illustrates a multi-channel accessing architecture in accordance with an exemplary embodiment of the present invention. The host 202 is coupled to a data storage device 204. By operating a controller 206 within the data storage device 204, the host 202 accesses the flash memory within the data storage device 204 through multiple channels CH0 . . . CH3 (parallel accessing). As shown in the figure, each channel is shared by two dies (numbered 0 and 1). The number 0 dies on all channels CH0 . . . CH3 are enabled by a chip enable signal CE0. The number 1 dies on all channels CH0 . . . CH3 are enabled by a chip enable signal CE1. The chip enable signals CE0 and CE1 are enabled in an interleaving manner. Through the multiple channels, parallel accessing is performed on the dies enabled in the interleaving manner. In an exemplary embodiment, all dies each have one page being accessed in the parallel accessing. The parallel accessed pages may be regarded as one super page. The frame line 208 indicates one super page, and the frame line 210 indicates one super block. According to the multi-channel accessing technology, one super block may be sequentially accessed from the lower numbered super page to the higher numbered super page. One super block is regarded as a cross-channel management unit used in a read-count group (wherein, the read-count group is defined in a conventional technique; and, by dividing a flash memory into read count groups, the read operations on the flash memory are counted in units of super blocks in the conventional technique). The controller 206 accesses the flash memory in parallel through all of the channels CH0 to CH3 and manages the parallel accessing based on the cross-channel management unit (e.g., performing the parallel accessing on one super page defined within one super block). The controller 206 allocates a parallel accessing space scattered over all the dies (accessed in parallel through all channels CH0 to CH3) based on the cross-channel management unit.

In an exemplary embodiment, the controller 206 dynamically manages a mapping table 212 that maps the super blocks to the flash memory. At the card opening, the super blocks are map to the flash memory in the order of the physical block numbers. For example, all number 0 blocks in the different dies are combined and managed as a number 0 super block, all number 1 blocks in the different dies are combined and managed as a number 1 super block, and so on. The mapping table 212 initially records such a sequential mapping relationship.

The data stored in the flash memory may become unreliable due to repeated reading. This phenomenon is called reading interference. In order to cope with reading interference, the present invention proposes a technique which updates the read count to show the frequency of reading in the area being monitored (for example, the read count is higher than a critical value). In an exemplary embodiment, unreliable data is moved to a safe space (e.g., a spare area) in time before the data becomes really damaged. In particular, the read counting of the present invention is not accumulating the number of read operations on all blocks of a complete super block. Instead, the monitored unit for each read count is smaller than one super block. In this way, transferring the entire super block to a safe space is not required. Simply moving the unreliable data of the small-sized monitored unit can reduce unnecessary data movement. Note that the movement of data will cause the released space to be erased. Because the lifespan of flash memory is related to the number of times the storage space is erased, too many iterations of erase operations and write operations will cause physical damage to the flash memory. The special size that is monitored by each read count, as shown in the present invention, can effectively reduce unnecessary data movement and extend the lifespan of flash memory.

In an exemplary embodiment, the monitored units are separated by the accessing channels. Within one super block, the reading operations on the blocks accessed through the same channel are counted by a read count. Referring to the super block 210, the two blocks 214 and 216 provided by die 0 and die 1 of channel 0 are monitored by a number 0 read count (e.g., any page reading on blocks 214 and 216 makes the #0 read count being incremented by 1), the two blocks 218 and 220 provided by die 0 and die 1 of channel 1 are monitored by a number 1 read count (e.g., any page reading on blocks 218 and 220 makes the #1 read count being incremented by 1), the two blocks 222 and 224 provided by die 0 and die 1 of channel 2 are monitored by a number 2 read count (e.g., any page reading on blocks 222 and 224 makes the #2 read count being incremented by 1), and the two blocks 226 and 228 provided by die 0 and die 1 of channel 3 are monitored by a number 3 read count (e.g., any page reading on blocks 226 and 228 makes the #3 read count being incremented by 1). In the other super blocks, the reading operations are monitored in the similar way. The controller 206 dynamically updates the read counts of all monitored units into a read count table 230 to monitor the frequently read areas. The monitored unit may be other sizes, which are discussed later.

As for the judgment of the read count, two thresholds are used in an exemplary embodiment of the present invention, which will be described below.

Figure 3:
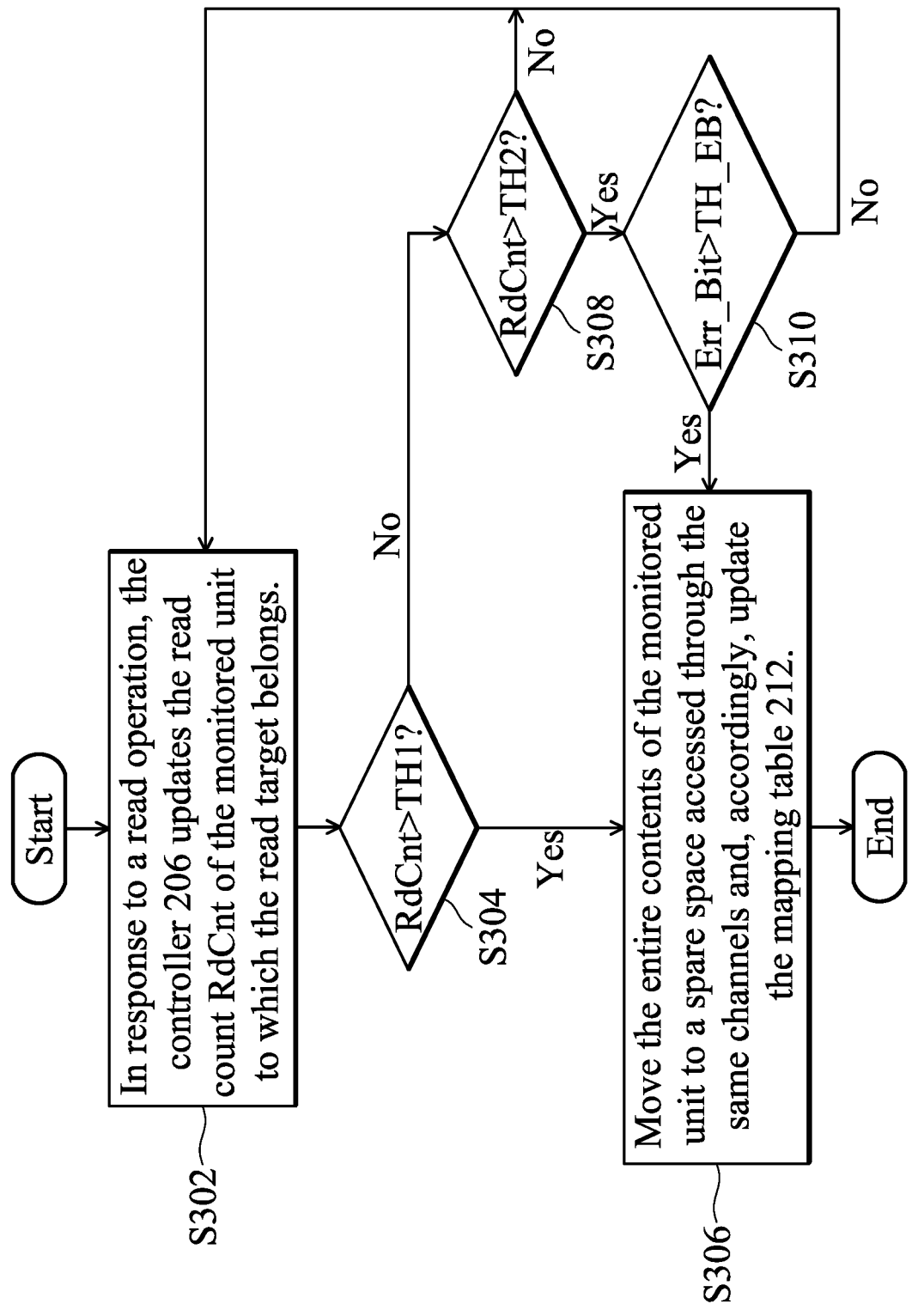
FIG. 3 is a flow chart illustrating a solution for reading interference in accordance with an exemplary embodiment of the present invention.

FIG. 3 is a flow chart illustrating a solution for reading interference in accordance with an exemplary embodiment of the present invention, in which two thresholds TH1 and TH2 are used. The threshold TH1 is higher than the threshold TH2.

In step S302, in response to a read operation, the controller 206 updates the read count RdCnt of the monitored unit to which the read target belongs.

In step S304, the controller 206 determines whether the updated read count RdCnt is above the threshold TH1. If yes, the flow proceeds to step S306, and the controller 206 completely moves the data of the monitored unit to a destination space (e.g., a spare space) of the same channel. In step S306, the controller 206 further updates the mapping table 212 in response to the data movement. The corresponding super block is correctly mapped to the physical space of the flash memory by the updated mapping table 212.

If it is determined in step S304 that the read count RdCnt does not exceed the threshold TH1, the flow proceeds to step S308, and the controller 206 compares the read count RdCnt with the lower threshold TH2. If the read count RdCnt does not exceed the threshold TH2, the flow returns to step S302.

If step S308 determines that the read count RdCnt is above the threshold TH2, the flow proceeds to step S310, and the controller 206 determines whether the bit error rate of the read target is higher than a critical value TH_EB. If yes, the flow proceeds to step S306 for the data transfer and the update of the mapping table 212. If not, the flow returns to step S302.

With reference to FIG. 2, the steps of FIG. 3 are further described in this paragraph as an example. When reading page 232 of the block 214 via channel 0, the controller 206 increments the number 0 read count RdCnt #0 (corresponding to the blocks 214 and 216) by 1 according to step S302. When the comparison performed in step S304 shows that the number 0 read count RdCnt #0 is above the threshold TH1, the controller 206 performs step S306 to move the entire contents of the blocks 214 and 216 to the blocks 234 and 236, and update the mapping table 212 to make a super block previously mapped to the blocks 214, 216, 218, 220, 222, 224, 226, and 228 now being mapped to the blocks 234, 236, 218, 220, 222, 224, 226, and 228. If the number 0 read count RdCnt #0 does not exceed the threshold TH1, step S308 is performed to compare the number 0 read count RdCnt #0 with the threshold TH2. If the number 0 read count RdCnt #0 not exceeding the threshold TH1 is above the threshold TH2, the controller 206 performs step S310 to check the bit error rate Err_Bit calculated from reading the page 232. In an exemplary embodiment, the bit error rate is calculated according to an error checking (ECC) technology. If the bit error rate calculated from reading page 232 is higher than the critical value TH_EB, the controller 206 performs step S306 to move the entire contents of the blocks 214 and 216 to a safe space, and update the mapping table 212 according to the data movement.

In summary, by comparing the read count RdCnt with the two-level thresholds TH1 and TH2, the unreliable data can be early detected. Even if the read count RdCnt of the monitored unit where the read target is located has not exceeded the threshold TH1, as long as it exceeds the threshold TH2, the controller 206 is triggered to check the bit error rate of the read target. Unreliable data, therefore, can be picked out, and data transfer of the complete monitored unit covering the unreliable data is performed.

The design of the two-level thresholds TH1 and TH2 may also have other variations.

There are various models of flash memory, depending on its unit storage capacity. The storage cells of SLC (Single Level Cell) flash memory each correspond to one bit of data. The storage cells of MLC (Multiple Level Cell) flash memory each correspond to two bits of data. The storage cells of TLC (Triple Level Cell) flash memory each correspond to three bits of data. The storage cells of QLC (Quad Level Cell) flash memory each correspond to four bits of data. The logical boundary of an SLC is clearer than that of a multi-level cell (MLC/TLC/QLC). An SLC not only has higher reliability, but also corresponds to the faster writing speed. Multi-level cells (MLCs/TLCs/QLCs) have their advantages in storage capacity.

However, due to cost considerations, the current mainstream flash memory on the market is multi-level cell (MLC/TLC/QLC) flash memory. The SLC flash memories are quite expensive. In the face of high accuracy and high speed requirements, a multi-level cell (MLC/TLC/QLC) flash memory can have some cells operated in a pseudo-single-level cell (pseudo SLC, or p-SLC) mode. In the p-SLC mode, storage cells are accurate as well as high speed. A much cheaper substitute for SLC flash memory is provided.

Figure 4:
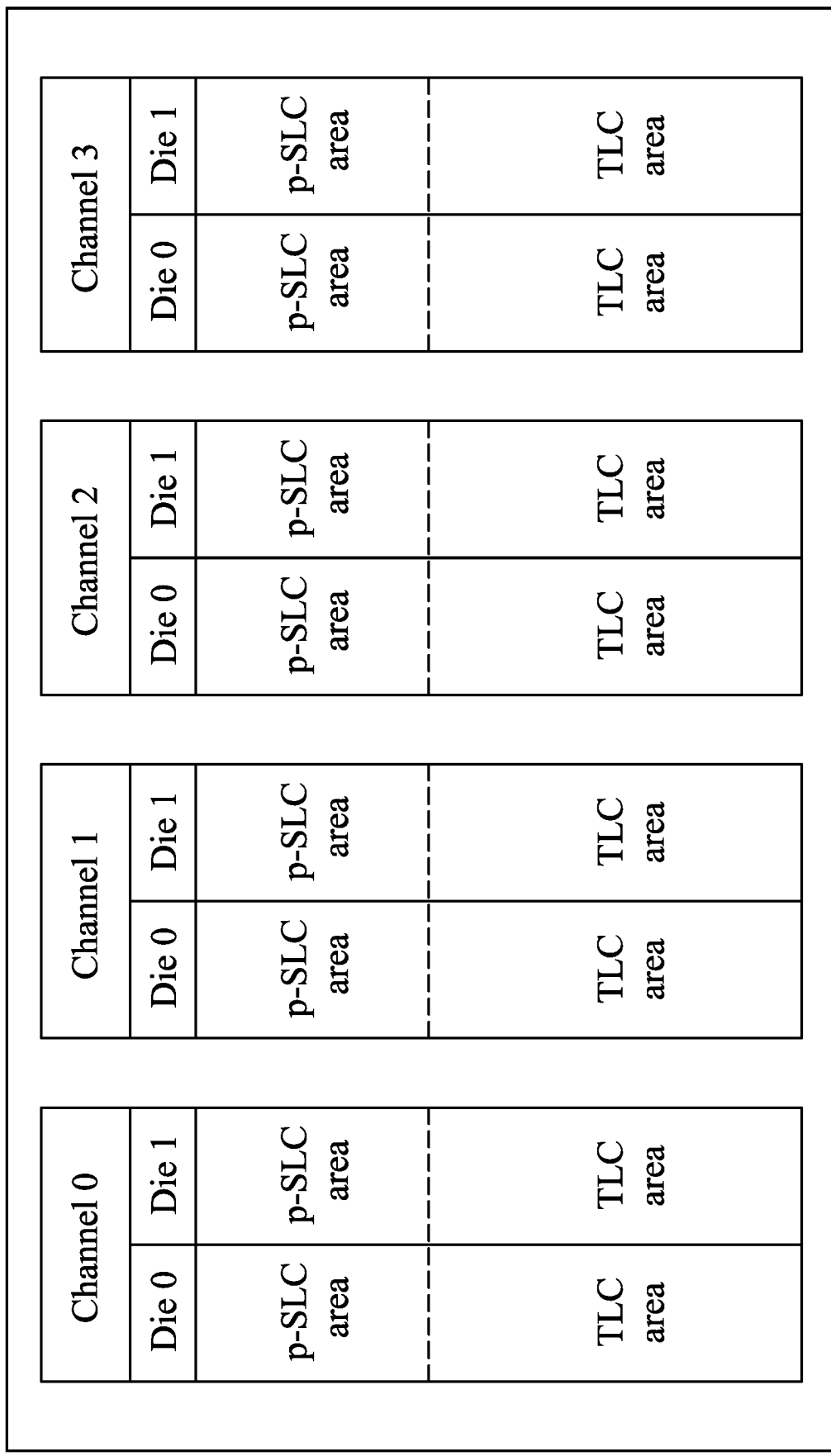
FIG. 4 illustrates the space allocation of a flash memory 400 in accordance with an exemplary embodiment of the present invention.

FIG. 4 illustrates the space allocation of a flash memory 400 in accordance with an exemplary embodiment of the present invention. The flash memory 400 is produced according to a triple-level cell (TLC) manufacture process. Each die has a fixed part to be operated as p-SLCs, and the rest remain are TLCs. The aforementioned thresholds TH1 and TH2 may be adjusted according to the different storage characteristics. For example, the aforementioned thresholds TH1 and TH2 are set as TH1_pSLC and TH2_pSLC in the p-SLC area, and are set as TH1_TLC and TH2_TLC in the TLC area. Since the p-SLC area is more stable than the TLC area, the threshold TH1_pSLC may be higher than the threshold TH1_TLC, and the threshold TH2_pSLC may be higher than the threshold TH2_TLC. In an exemplary embodiment, the threshold TH1_pSLC is 2 million times of reading, which is higher than the threshold TH1_TLC that is set to 1.5 million times of reading; and the threshold TH2_pSLC is 1.5 million times of reading, which is higher than the threshold TH2_TLC set to 1 million times of reading.

The following paragraphs discuss the various sizes of monitored unit.

In an exemplary embodiment, each monitored unit is a single block within a die. For example, within the super block 210, the eight blocks 214, 216, 218, 220, 222, 224, 226, and 228 each correspond to a read count. Each time only one unreliable block (determined based on the corresponding read count) is copied to another space. There is no need to copy the reliable blocks within the same super block.

In an exemplary embodiment, each monitored unit includes multiple blocks provided by the different dies accessed through a part of the available channels (rather than all channels). For example, within the super block 210, the four blocks 214, 216, 218, and 220 accessed through channels 0 and 1 correspond to a number 0 read count, and the four blocks 222, 224, 226, and 228 accessed through channels 2 and 3 correspond to a number 1 read count. Each time only four unreliable blocks (determined based on the corresponding read count) are copied to another space. There is no need to copy the reliable blocks within the same super block.

Other implementations that do not use each super block as the monitored unit for read counting also belong to the technical scope of the present invention. The number of channels is not limited to 4. Each channel is not limited to be shared by just two dies.

In an exemplary embodiment, the flash memory is composed of N×M dies accessed by the controller in parallel via N channels. Each channel is shared by M dies in an interleaving manner. N and M are integers. The N×M dies each provides one block to form a super block that is managed as a cross-channel management unit. Each block includes a plurality of pages. Each read target is one page.

In an exemplary embodiment, in every M dies of the same channel, each die provides one block to form one monitored unit, and thereby each monitored unit includes M blocks. The controller moves M blocks with reading interference to a destination space (being also in the size of the monitored unit) in the same channel without moving the other (N−1)×M blocks that are in the same super block as the M blocks with reading interference. The controller changes to manage the destination space and the non-shifted (N−1)×M blocks as one super block.

In an exemplary embodiment wherein each monitored unit is one block, the controller moves the block with reading interference to a spare destination block in the same die without moving the other (N−1)×M blocks within the same super block as the unreliable block. The controller changes to manage the non-shifted (N−1)×M blocks and the destination block as one super block.

In an exemplary embodiment, for the K×M dies in each group of K channels, each die provides one block to form one monitored unit, and thereby each monitored unit includes K×M blocks. N is an integer multiple of K. The controller moves K×M blocks with reading interference to a destination space in the same K channels without moving the other (N−K)×M blocks that are in the same super block as the K×M blocks with reading interference. The controller changes to manage the destination space and the non-shifted (N−K)×M blocks as one super block.

The aforementioned technology may be applied to other types of non-volatile memory (e.g., a magnetoresistive random access memory, a ferroelectric random access memory, a resistive random access memory, a spin transfer torque random access memory . . . etc.).

A data storage device in accordance with an exemplary embodiment of the present invention includes a non-volatile memory and a controller coupled to the non-volatile memory via a plurality of channels. When reading a read target on the non-volatile memory, the controller increases the read count of the monitored unit to which the read target belongs and, based on the read count, determines whether to move data of the monitored unit covering the read target to a safe space to deal with reading interference. The monitored unit is smaller than a cross-channel management unit. The controller accesses a parallel accessing space of the non-volatile memory in parallel through all of the channels and allocates the parallel accessing space based on the cross-channel management unit.

The forgoing techniques by which the controller operates the non-volatile memory may be implemented in the other structures. For read counting, any size of monitored unit, designed based on the aforementioned concepts, fall within the scope of protection of this case. Control methods based on the aforementioned concepts are also proposed.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
 a non-volatile memory; and
 a controller, coupled to the non-volatile memory to access the non-volatile memory through multiple channels,
 wherein:
 when reading a read target on the non-volatile memory, the controller increases a read count of a monitored unit to which the read target belongs and, based on the read count, determines whether to move data of the monitored unit covering the read target to a safe space;
 the monitored unit is smaller than a cross-channel management unit in size;
 the controller accesses a parallel accessing space of the non-volatile memory in parallel through all of the channels and allocate the parallel accessing space based on the cross-channel management unit;
 the non-volatile memory includes a pseudo-single-level cell storage area and a multi-level cell storage area;
 when the read target is within the pseudo-single-level cell storage area and the read count is above a third threshold, the controller moves the data of the monitored unit covering the read target to the safe space;
 when the read target is within the multi-level cell storage area and the read count is above a fourth threshold, the controller moves the data of the monitored unit covering the read target to the safe space; and
 the third threshold is higher than the fourth threshold.

2. The data storage device as claimed in claim 1, wherein:
 when the read target is within the pseudo-single-level cell storage area, and the read count does not exceed the third threshold but above a fifth threshold, which is lower than the third threshold, the controller checks a bit error rate of the read target; and when the bit error rate is higher than a critical value, the controller moves the data of the monitored unit covering the read target to the safe space.

3. The data storage device as claimed in claim 2, wherein:

when the read target is within the multi-level cell storage area, and the read count does not exceed the fourth threshold but above a sixth threshold, which is lower than the fourth threshold, the controller checks the bit error rate of the read target; and when the bit error rate is higher than the critical value, the controller moves the data of the monitored unit covering the read target to the safe space.

4. The data storage device as claimed in claim 3, wherein:
the fifth threshold is higher than the sixth threshold.

5. The data storage device as claimed in claim 1, wherein:
the non-volatile memory is a flash memory having N×M dies to be accessed in parallel by the controller through N channels, each channel is shared by M dies in an interleaving manner, and N and M are integers;

the N×M dies each provide a block to form a cross-channel management unit that is managed as a super block; and each block includes a plurality of pages, and the read target is one page.

6. The data storage device as claimed in claim 5, wherein:
each of M dies of the same channel provides one block to form one monitored unit, and thereby each monitored unit includes M blocks; and the controller moves M blocks with reading interference to a destination space in the same channel without moving the other (N−1)×M blocks that are in the same super block as the M blocks with reading interference; and the controller changes to manage the destination space and the non-shifted (N−1)×M blocks as one super block.

7. The data storage device as claimed in claim 5, wherein:
each monitored unit is one block;
the controller moves one block with reading interference to a destination block in the same die without moving the other (N×M−1) blocks that are in the same super block as the block with reading interference; and the controller changes to regard the destination block and the non-shifted (N×M−1) blocks as one super block.

8. The data storage device as claimed in claim 5, wherein:
in each group of K channels, K×M dies each provides one block to form one monitored unit, and thereby each monitored unit includes K×M blocks;

N is an integer multiple of K;

the controller moves K×M blocks with reading interference to a destination space in the same K channels without moving the other (N−K)×M blocks that are in the same super block as the K×M blocks with reading interference; and the controller changes to manage the destination space and the non-shifted (N−K)×M blocks as one super block.

9. A non-volatile memory control method, comprising:
accessing the non-volatile memory through multiple channels;

when reading a read target on the non-volatile memory, increasing a read count of a monitored unit to which the read target belongs; and based on the read count, determining whether to move data of the monitored unit covering the read target to a safe space, wherein:
the monitored unit is smaller than a cross-channel management unit in size;

a parallel accessing space of the non-volatile memory is accessed in parallel through all of the channels, and the parallel accessing space is allocated based on the cross-channel management unit; and the non-volatile memory control method further comprises moving the data of the monitored unit covering the read target to the safe space when the read target is within a pseudo-single-level cell storage area of the non-volatile memory and the read count is above a third threshold, and moving the data of the monitored unit covering the read target to the safe space when the read target is within a multi-level cell storage area of the non-volatile memory and the read count is above a fourth threshold, wherein the third threshold is higher than the fourth threshold.

10. The non-volatile memory control method as claimed in claim 9, further comprising:

checking a bit error rate of the read target when the read target is within the pseudo-single-level cell storage area, and the read count does not exceed the third threshold but above a fifth threshold, which is lower than the third threshold; and moving the data of the monitored unit covering the read target to the safe space when the bit error rate is higher than a critical value.

11. The non-volatile memory control method as claimed in claim 10, further comprising:

checking the bit error rate of the read target when the read target is within the multi-level cell storage area, and the read count does not exceed the fourth threshold but above a sixth threshold, which is lower than the fourth threshold; and moving the data of the monitored unit covering the read target to the safe space when the bit error rate is higher than the critical value.

12. The non-volatile memory control method as claimed in claim 11, further comprising:
the fifth threshold is higher than the sixth threshold.

13. The non-volatile memory control method as claimed in claim 9, wherein:

the non-volatile memory is a flash memory having N×M dies to be accessed in parallel through N channels, each channel is shared by M dies in an interleaving manner, and N and M are integers;

the N×M dies each provide a block to form a cross-channel management unit that is managed as a super block; and each block includes a plurality of pages, and the read target is one page.

14. The non-volatile memory control method as claimed in claim 13, wherein:

in every M dies of the same channel, each die provides one block to form one monitored unit, and thereby each monitored unit includes M blocks; and M blocks with reading interference are moved to a destination space in the same channel, and the other (N−1)×M blocks in the same super block as the M blocks with reading interference are not moved; and the destination space and the non-shifted (N−1)×M blocks are managed as one super block.

15. The non-volatile memory control method as claimed in claim 13, wherein:
  each monitored unit is one block;
  one block with reading interference is moved to a destination block in the same die, and the other (N×M−1) blocks in the same super block as the block with reading interference are not moved; and
  the destination block and the non-shifted (N×M−1) blocks are regarded as one super block.

16. The non-volatile memory control method as claimed in claim 13, wherein:
  K×M dies in a group of K channels each provide one block to form one monitored unit, and thereby each monitored unit includes K×M blocks;
  N is an integer multiple of K;
  K×M blocks with reading interference are moved to a destination space in the same K channels, and the other (N−K)×M blocks in the same super block as the K×M blocks with reading interference are not moved; and
  the destination space and the non-shifted (N−K)×M blocks are managed as one super block.

\* \* \* \* \*